US008888945B2

(12) United States Patent
Broad et al.

(10) Patent No.: US 8,888,945 B2
(45) Date of Patent: Nov. 18, 2014

(54) LABEL APPLICATOR HAVING A HEAT IDLER

(75) Inventors: Gavin John Broad, Liberty Township, OH (US); Adal Tecleab, Woodlawn, OH (US); Jason Lee DeBruler, West Chester, OH (US)

(73) Assignee: The Procter & Gamble Company, Cincinnati, OH (US)

( * ) Notice: Subject to any disclaimer, the term of this patent is extended or adjusted under 35 U.S.C. 154(b) by 662 days.

(21) Appl. No.: 13/098,619

(22) Filed: May 2, 2011

(65) Prior Publication Data

US 2011/0203730 A1 Aug. 25, 2011

Related U.S. Application Data

(63) Continuation of application No. 12/622,760, filed on Nov. 20, 2009, now Pat. No. 7,955,469.

(30) Foreign Application Priority Data

May 13, 2009 (CA) ..................................... 2664772

(51) Int. Cl.

| | |
|---|---|
| ***B29C 65/00*** | (2006.01) |
| ***B31B 1/60*** | (2006.01) |
| ***B32B 37/00*** | (2006.01) |
| ***B44C 1/165*** | (2006.01) |
| ***B44C 1/17*** | (2006.01) |
| ***B65C 9/18*** | (2006.01) |
| ***B32B 38/10*** | (2006.01) |
| ***B32B 38/04*** | (2006.01) |
| ***B32B 38/14*** | (2006.01) |
| ***H05K 13/04*** | (2006.01) |
| ***C09J 5/00*** | (2006.01) |
| ***B65C 9/25*** | (2006.01) |
| ***B65C 11/06*** | (2006.01) |
| ***C09J 5/06*** | (2006.01) |
| ***B65C 11/02*** | (2006.01) |
| ***B65C 9/46*** | (2006.01) |
| ***B65C 9/26*** | (2006.01) |
| *B65C 9/00* | (2006.01) |

(52) U.S. Cl.

CPC ................. *B65C 9/26* (2013.01); *B65C 9/1873* (2013.01); *B65C 2009/0081* (2013.01); *B65C 9/25* (2013.01)

USPC ............. 156/285; 156/60; 156/230; 156/235; 156/238; 156/249; 156/250; 156/277; 156/297; 156/311; 156/320; 156/322; 156/359; 156/361; 156/384; 156/387; 156/541; 156/542; 156/583.1

(58) Field of Classification Search

USPC ......... 156/238, 230, 361, 542, 235, 541, 277, 156/285, 60, 249, 297, 387, 250, 384, 311, 156/320, 322, 359, 583.1

See application file for complete search history.

(56) References Cited

U.S. PATENT DOCUMENTS

| | | | |
|---|---|---|---|
| 4,536,434 | A | 8/1985 | Magnotta |
| 4,612,076 | A | 9/1986 | Moss |

(Continued)

FOREIGN PATENT DOCUMENTS

| | | |
|---|---|---|
| EP | 0006179 | 1/1980 |
| WO | WO97/13645 | 4/1997 |

OTHER PUBLICATIONS

International Search Report and Written Opinion from the International Searching Authority, mailed on Jun. 27, 2011, International Application No. PCT/US2010/033859, 12 pages.

(Continued)

*Primary Examiner* — Richard Crispino
*Assistant Examiner* — Matthew Hoover
(74) *Attorney, Agent, or Firm* — Gary J. Foose

(57) ABSTRACT

The use of a heat idler moveable along a path provides speed and flexibility in the heat labeling of containers.

9 Claims, 3 Drawing Sheets

(56) References Cited

U.S. PATENT DOCUMENTS

| | | | | | |
|---|---|---|---|---|---|
| 4,732,641 | A | * | 3/1988 | Nechay et al. | 156/448 |
| 4,735,664 | A | * | 4/1988 | Asghar et al. | 156/64 |
| 5,248,355 | A | | 9/1993 | Olsen | |
| 5,250,129 | A | | 10/1993 | Twele | |
| 5,306,375 | A | | 4/1994 | Leonard | |
| 6,083,342 | A | | 7/2000 | Frey | |
| 6,485,402 | B1 | | 11/2002 | Bauer | |
| 7,892,383 | B2 | | 2/2011 | Broad | |
| 2004/0261948 | A1 | | 12/2004 | Brandt et al. | |
| 2007/0209753 | A1 | | 9/2007 | Gonzalez et al. | |
| 2010/0288437 | A1 | | 11/2010 | Broad | |

OTHER PUBLICATIONS

Notice of Allowance, U.S. Appl. No. 12/622,760, mailed on Feb. 1, 2011, 7 pages.

Notice of Allowance, U.S. Appl. No. 12/622,760, mailed on Oct. 19, 2010, 7 pages.

Final Office Action, U.S. Appl. No. 12/622,760, mailed on Jun. 28, 2010, 10 pages.

Non Final Office Action, U.S. Appl. No. 12/622,760, mailed on Mar. 10, 2010, 11 pages.

Notice of Allowance, U.S. Appl. No. 12/622,728, mailed on Oct. 15, 2010, 7 pages.

Non Final Office Action, U.S. Appl. No. 12/622,728, mailed on Feb. 12, 2010, 10 pages.

Non Final Office Action, U.S. Appl. No. 12/622,728, mailed on Sep. 8, 2010, 12 pages.

Office Action for U.S. Appl. No. 12/622,728, date mailed Feb. 12, 2010.

Office Action for U.S. Appl. No. 12/622,728, date mailed Sep. 8, 2010.

Notice of Allowance for U.S. Appl. No. 12/622,728, date mailed Oct. 15, 2010.

* cited by examiner

LABEL APPLICATOR HAVING A HEAT IDLER

CROSS-REFERENCE TO RELATED APPLICATION

This application is a continuation of application Ser. No. 12/622,760, filed Nov. 20, 2009 now U.S. Pat. No. 7,955,469.

FIELD OF THE INVENTION

The present invention is directed to an apparatus, and methods of using the same, for labeling containers.

BACKGROUND OF THE INVENTION

Two examples of labels that are placed on container, such as bottles, include a heat transfer label (also known as heat activated web) and a pressure sensitive label (also known as self adhesive labels). Many machines can apply heat transfer labels at speeds at only about 100 to about 150 bottles per minute. Many of these heat transfer label machines can only be operated at a single speed or at a narrow speed ranges, or have limitations imposed by container geometries. Many machines can only apply one type of label, i.e., heat transfer labels or pressure sensitive labels, but not both types of labels. There is also a need to improve the pressure sensitive label process to allow the application of pressure sensitive labels to a broader range of container and/or label geometries.

See e.g., U.S. Pat. Nos. 5,248,355; 5,250,129; 5,306,375; and 6,083,342.

SUMMARY OF THE INVENTION

The present invention attempts to address these and other needs by providing, in one aspect of the invention an apparatus for labeling a container that comprises a first winder capable of unwinding a heat transfer label from a heat transfer label roll. The heat transfer label comprises a heat label releasably affixed to a heat label web. The apparatus also comprises a heat idler, comprising a roller, affixed along a path, and wherein the roller is moveable along the path to adjust the distance relative to a heating surface. The roller rolls unwound heat transfer label to define a heating contact length of the heat transfer label against the heating surface. The heating contact length depends upon the position of the roller along the path. The apparatus also comprises a heat label applicator capable of applying a heat label to a container, heated from the heating surface, to provide a labeled container and the heat label web.

Another aspect of the invention provides for a method of labeling a container comprising the following steps. Unwinding a heat transfer label from a heat transfer label roll. Rolling unwound heat transfer label along a roller of a heat idler affixed along a path. Heating the heat transfer label, rolled from the third low inertia roller, along a heating surface of a heater plate, wherein the distance the heat transfer label passes along the heating surface comprising a heating contact length. Moving the roller of the heat idler along the path to change the heating contact length. The method also comprises applying a heat label to a container from the heated transfer label to provide a labeled container and a heat transfer web.

A third aspect of the invention provides for a consumer product comprising a labeled container, wherein the labeled container is made according to the method or apparatus previously described.

DETAILED DESCRIPTION OF THE INVENTION

Different aspects of the invention include, but are not limited to: an apparatus for applying a heat transfer label and/or a pressure sensitive label to a container; and methods of using the apparatus.

In one aspect of the invention, the apparatus may apply heat transfer label in one web path direction and generally using the same components and with slight modification(s) (e.g., adding/removing chiller; adding/removing application beak and wiper; adding/removing heater plate; adding removing a label registration sensor; and combinations thereof) may apply pressure sensitive label in the other direction, and vice versa. The apparatus may comprise one or more (or combination thereof) of the following components: first winder, first idler, first vacuum box, first nip, heat idler, heater plate, heat label applicator, third idler (i.e., "cooling idler"), web chiller, second nip, second vacuum box, fourth idler, second winder, and combinations thereof. It is appreciated, that since the apparatus can be used in two different directions (depending upon which type of label is being used), a particular component of the apparatus may serve two different functions. For example, a winder can function to unwind label in one direction and can also serve to rewind label webbing in the other direction. Some components may be removed or added depending on web path direction (e.g., web chiller if a pressure label is being applied).

Heat Transfer Labeling and Pressure Transfer Labeling

Figure 1:
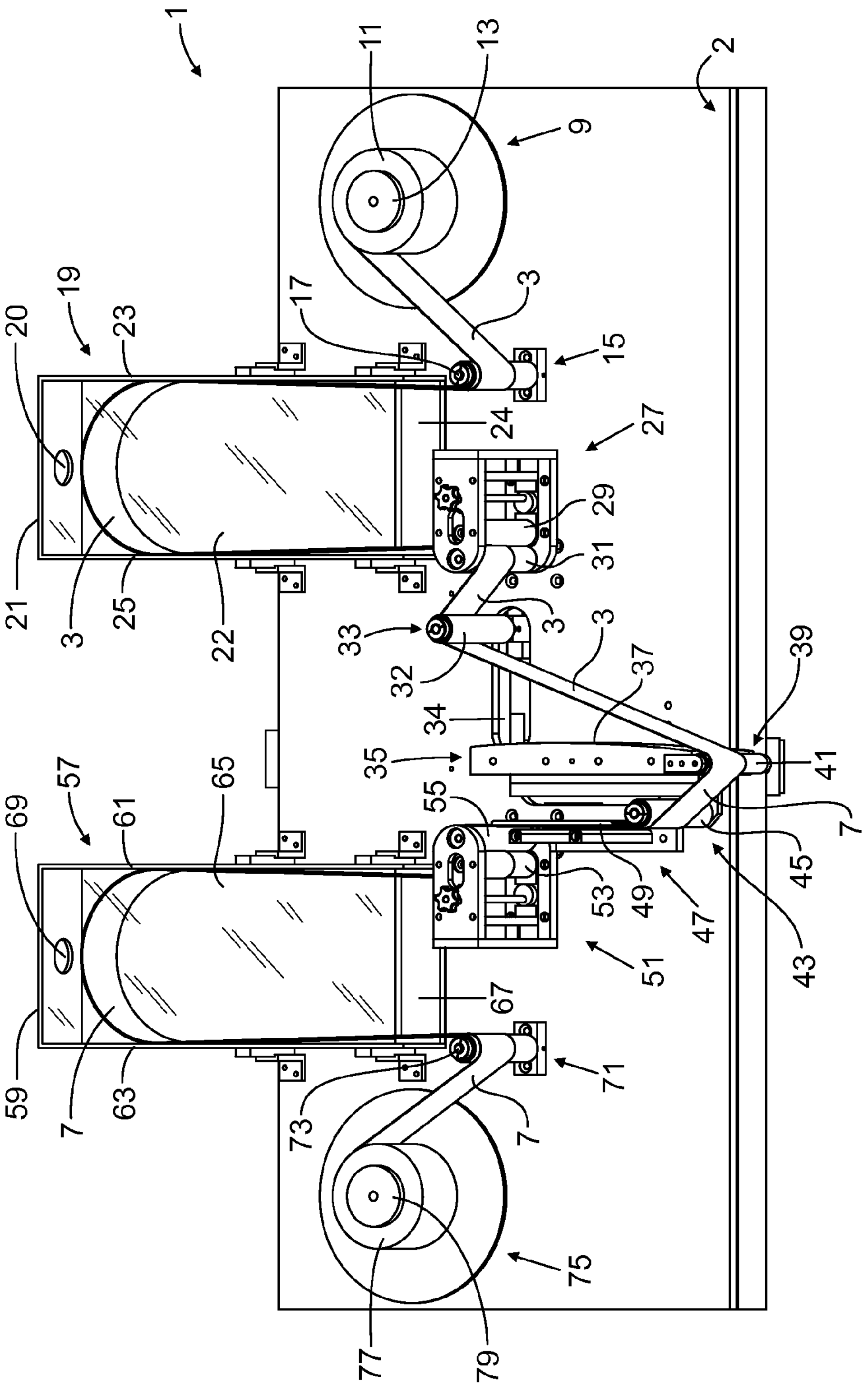
FIG. 1 is a perspective view of an apparatus of the present invention.

Turning to FIG. 1, one aspect of the invention provides for an apparatus (1) for applying a heat transfer label (3) to a container (not shown). Another aspect of the invention provides for an apparatus (1) for applying a pressure label (not shown) to a container. The apparatus (1) may be configured to apply heat labels in one direction and be configured to apply pressure labels in the other direction. The term "container" is used herein the broadest to include any bottle, vessel, box, or the like including a breadth of sizes. Containers are typically comprised of plastic or paper or combination thereof. In one embodiment, the container is capable of containing a consumer product (e.g., laundry detergent or fabric softener). Containers, by way of example, may hold from 100 ml to about 10 liters, alternatively from 200 ml to about 5 liters, of consumer product. The consumer product may be liquid, solid, semi-liquid, semi-solid, granular, semi-granular, or combinations thereof. Containers are typically empty, i.e. devoid of consumer product, when conveyed through the labeling processes.

First Winder

A first winder (9) unwinds a heat transfer label (3). The first winder may center driven or may be a surface driven. The winder (9) may also be used to wind pressure label web (not shown).

A heat transfer label (3) is typically comprised of heat labels (not shown) printed on a heat label web (7). The heat labels may be discrete or may be non-discrete. It is the heat label of the heater transfer label (3) that is ultimately placed on the container (not shown). The heat label web (7) is typically wound at the end of the labeling process (e.g., by a second winder (75)). Heat transfer label (3) is commercially available and is typically provided on a heat transfer label roll (11). Non-limiting examples of commercial suppliers of heat transfer labels include Graphic Packaging International, Inc., Cincinnati, Ohio, and Multi-Color Corporation, Sharonville, Ohio.

A pressure transfer label is typically comprises of pressure labels (now shown) on a pressure label web. The pressure labels may be discrete or may be non-discrete. It is the pressure label of the pressure transfer label that is ultimately placed on the container. The pressure transfer label web is typically wound at the end of the labeling process (e.g., by a first winder (9)). Pressure transfer label is commercially available and is typically provided on a pressure transfer label roll (10).

The first winder (9) comprises a first servo motor driven spindle (13) that a heat transfer label roll (11) is functionally attached onto. The first winder (9) may also comprise a first servo motor (not shown) that is operably connected to the spindle of the first servo motor driven spindle (13), wherein the first servo motor is capable of providing rotational torque and/or rotational speed to the spindle of the first servo motor driven spindle (13). The first servo motor applies tension as to control the speed at which the heat transfer label (3) is unwound from its roll (11) thereby controlling the speed at which the heat transfer label (3) is feed downstream into the apparatus (1)/labeling process. Of course other embodiments of the invention, the tension may be applied from other points downstream in the labeling process.

The first servo motor (of the first servo motor driven spindle (13)) may also be linked to a central program logic controller ("PLC") (not shown) that coordinates data from various points along the components of the apparatus (1) to control inter alia the speed (and direction) of the labeling process. In other embodiments, a constant speed surface drive may be used.

The decreasing diameter of attached heat transfer label roll (11) during the labeling process may need to be accounted for by adjusting the speed and/or torque of the first servo motor. The PLC may be used to adjust this speed and/or torque.

PLC hardware may be obtained from Rockwell Automation, Milwaukee, Wis. Relevant hardware products may include 1756 ControlLogix PLC, including: Power Supply (1756-PB72), Processor (1756-L61/B), Ethernet Bridge (1756-ENBT), SERCOS Motion Module (1756-M08SE), Digital Input Module (1756-IB16), Digital Output Module (1756-OB16E), and Analog Input Module (1756-1E8).

PLC software may also be obtained from Rockwell Automation. Relevant software products may include: RSLogix 5000 (v16.03.00), FactoryTalk View Studio ME (v 5.00.00), FactoryTalk View ME Station, RSLinx Classic (v 2.52.00.17).

Drive information, i.e., electrical control of selected motors of the apparatus, may yet also be obtained from Rockwell Automation. Relevant products may include Kinetix 6000 Multi-axis Servo Drives, including: Integrated Axis Module (2094-BC07-M05-S), and Axis Module (2094-BM02-S).

A non-limiting example of a servo motor includes Allen Bradley MPL 330 Servo Motors coupled with an Alpha in line SP075 gear box.

First Idler

The apparatus (1) may comprise a first idler (15) preferably comprising a roller, more preferably a first low inertia roller (17). The first idler (15) guides unwound heat transfer label (3) entering into a first vacuum box (19). As the diameter of the attached heat transfer label roll (11) decreases, the angle at which the heat transfer label (3) exits the first winder (9) changes. The first idler (15) provides a constant feed angle (e.g., about 1-2 degrees) of the heat transfer label (3) into the first vacuum box (19).

The first low inertia roller (17) is comprised of a carbon fiber hub affixed to an axel (not shown) and wherein the hub may radially rotate around the axel wherein the axel is perpendicular relative to the top surface (2) of the apparatus (1). The carbon fiber hub rotates around the axel on open race ball bearings (not shown) held inside a carbon fiber shell (not shown). Such bearings and a shell are each available from McMaster Can 6100, Atlanta, Ga.

In one embodiment, the first low inertia roller (17) comprises an overall about 3.8 cm diameter roller that is preferably substantially comprised of materials (such as carbon fiber) to reduce the inertia of the first idler (15). Without wishing to be bound by theory, a low inertia roller typically provides better performance, as compared to a higher inertia roller, when the heat transfer label is abruptly stopped and started during the labeling process. In another embodiment, the height (i.e., perpendicular to the top surface of apparatus (2)) of the first low inertia roller comprises about 18 centimeters (cm) as measured from the top surface (2) of the apparatus (1). Non-limiting examples of commercially available low inertia rollers include Double E Company, LLC, West Bridgewater, Mass. The height of the rollers of the present invention will depend, at least in part, to the width of the heat transfer label (3) or pressure transfer label.

Although the term "low inertia roller" is used throughout the specification, one skilled in the art will appreciate that invention is not limited to those rollers with "low inertia," but rather those rollers with lower inertia are preferred.

First Vacuum Box

The apparatus (1) comprises a first vacuum box (19) vacuuming the heat transfer label (3) contained therein and received from the first idler (15) (or other such upstream component(s)). Alternatively the vacuum box (19) vacuums the pressure label web received from the upstream processes of pressure labeling.

Generally speaking (and without limitation), the "vacuum box" (19, 57) is not limited to a six sided rectangular box (as shown in FIG. 1), but rather any container that is capable of containing at a least a portion of a continuous heat transfer label (3) or pressure transfer label and a vacuum that may be applied to at least a portion of the label (3) contained in the container.

In one embodiment, the vacuum box (19, 57) may be of a parallepiped, spherical, conical, or cylindrical shape, and the like. The label (3) may enter or exit into the container through an open side or a slot, hole, etc., of the container. The vacuum may be created in the container by creating a vacuum through an open side or slot, hole, etc. of the container.

In one embodiment, the vacuum box (19, 57) is six sided rectangle, with walls on five of the six sides, wherein at a least a portion of the: continuous, heat transfer label (3), (or heat label web (7)); or pressure transfer label, (or pressure label web) enters/exists through one side (of the six sides) that is open (i.e., one side does not have a wall thereby exposing the interior of the vacuum box (19, 57)). A vacuum hose (attached to a vacuum pump that is motor driven providing a vacuum, preferably a constant vacuum) is attached to another side of the six sided vacuum box (preferably opposite the side the label (3) or web (7) enters/exits the vacuum box (19, 57)) to create the vacuum pressure. The five walls of the vacuum box may be made from PLEXIGLAS or clear plastic. A typical vacuum range in a vacuum box (19, 57) is about 2 to about 6 inches of water, alternatively from about 0.5 kPa to about 1.5 kPa.

Referencing FIG. 1, the heat transfer label web (7) downstream to the first vacuum box (19) in labeling process is subject to dynamic motion (e.g., linear oscillating motion of the heat label applicator (39) applying labels to containers, and/or the indexing the heat transfer label). The first vacuum box (19) disengages this motion of the downstream components/processes from the upstream unwinding step. In other words, the first vacuum box allows the unwinding process to be constant verses indexed. An indexed unwinding step would prove challenging when the attached heat transfer label roll (11) has a high polar moment of inertia (e.g., given a large roll). "Indexed unwinding" means the label (3) moves forward, then stops, then moves backwards, and then forwards again; or the label (3) moves forward, then stops, then moves forward again; or combinations thereof.

Without wishing to be bound by theory, it is believed the use of one, two, or more of the vacuum boxes (19, 57) described herein is what allows the labeling speed to be higher than many described in the art and/or allow the speed of the labeling process to be modified (e.g., start, stopped, increased, decreased). Generally, and without wishing to be bound by theory, the vacuum box(es) (19, 57) lower the polar moment inertia characterized by high speed labeling thereby decreasing stress during the acceleration/decelerations of the dynamic motion of labeling.

The vacuum boxes (19, 57) of the present invention may each comprise a vacuum means (one or more vacuums vacuuming the interior of one or more of the vacuum boxes) to contain the heat transfer label (3) or web (7) in a catenary configuration (with the "bottom" of the catenary typically nearest the vacuum opening (20, 69) to the vacuum means). The term "catenary configuration" means broadly a loop, festoon, curve, or the like, -shape of the label (3) or web (7, 6) as a result of the label (3) or web (7, 6) being vacuumed toward the vacuum opening (20, 69) (and the vacuum provided by the vacuuming means). In a preferred embodiment, the vacuum opening (20, 69) of the vacuum box (19, 57) is opposite the side the label (3) or web (7, 6) enters/exits the vacuum box (19, 57) (as shown in FIG. 1). The planar area of the side that label (3) or web (7, 6) enters/exists the vacuum box (19, 57) is typically much large than the area of the vacuum opening (20, 69), comprising a ratio of about 3:1, 4:1; 5:1; 6:1; 7:1; 8:1, or the like, respectively.

The first vacuum box (19) may comprise five walls to form an open ended container or box. The first vacuum box (19) may comprises a first back wall (21), a first side wall (23), and a second side wall (25); wherein the first and second side walls (23, 25) are about parallel to each other; and wherein the first and second side walls (23, 25) are about perpendicular to the first back wall (21). The first back wall (21) of the first vacuum box (19) may comprise a first vacuum opening (20) where a vacuum hose is attached (not shown) to create a vacuum by a vacuum motor to suction the heat transfer label (3) toward the first back wall (21). A non-limiting example of a vacuum motor may include a regenerative blower Model R2 Gast Manufacturing, Inc., Benton Harbor, Mich.

The length (i.e., the longest dimension) of the first back wall (21) is about 26 cm. The length (i.e., the longest dimension) of the first and second side walls (23, 25) is about 62 cm. The width of the first back wall (21), first side wall (23), and second side wall (25) are each about 11.5 cm, 11.5 cm, 11.5 cm, respectively. Of course this dimension will depend upon the width of the label (3)/web (7) (and the need to for the label/web to be contained within the vacuum box (19, 57) and minimize the contained volume inside the vacuum box (19, 57) to maximize the vacuum created by the vacuuming means).

The first top wall (22) and first bottom wall (24) contain the label (3)/web (7) within the first vacuum box (19). The length (i.e., the long dimension) of the first top wall (22) and first bottom wall (24) is 62 cm, whereas the width of the wall is 25 cm. The volume contained inside of the first and second vacuum box (19, 57) is about 18,500 $cm^3$. In one embodiment, the volume contained inside the first vacuum box (19) or second vacuum box (57) is from about 10,000 $cm^3$ to about 30,000 $cm^3$, alternatively from about 5,000 $cm^3$ to about 50,000 $cm^3$.

One skilled in the art will appreciate that there are at least two ways of controlling the tension of the label (3)/web (7) in a vacuum box (i.e., first vacuum box (19) and second vacuum box (57)): (i) adjusting the vacuum (i.e., increasing or lowering the vacuum as measured by inches of water); and/or (ii) increasing the length (i.e., longest dimension) of the back wall (21) thereby the "loop" created by the label (3)/web (7) within the vacuum box (19, 57) is larger, which in turn increases the surface area of the label (3)/web (7) that is exposed to the vacuum. The skilled artisan will readily adjust these variables to maximize operating conditions.

One skilled in the art will also appreciate that the label (3)/web (7) will contact the first side wall (23) and the second side wall (25) of the first vacuum box (19), but preferably not contact the first back wall (21) of the first vacuum box (19), while the apparatus (1) is being operating during the container labeling process. The same can hold true, by analogy, to the second vacuum box (57).

In one embodiment, an ultrasonic sensor (not shown) (e.g., FW Series from Keyance, Cincinnati, Ohio) or other such device, is used to measure and report the distance of the label (3)/web (7) relative to the first back wall (21) or second back wall (59). In other words, the ultrasonic sensor may dynamically measure the "depth of the catenary" of the label (3)/web (7) contained in the vacuum box (19, 57) to provide this data to the PLC, which in turn may adjust/coordinate, for example, the servo motor of the first servo motor driven spindle (13) or the servo motor of the fourth servo motor driven spindle (79) (and other points of the apparatus (1)), to maintain the optimized depth of the loop. The ultrasonic sensor and/or vacuum may each also be connected to the PLC to be coordinated among the various components of the apparatus (1) and adjusted accordingly. In one embodiment, during the labeling operation, the closest distance measured from the surface the label (3)/web (7) relative to the surface of the back wall (21, 59) facing the label (3)/web (7) is from about 1 cm to about 40 cm, alternatively from 3 cm to about 30 cm. In yet another embodiment, at least a portion of the label (3)/web (7) contained within the vacuum box (19, 57) has a defined length (during the labeling operation). This length may comprise from about 50 cm to about 250 cm, alternatively from about 100 cm to about 200 cm.

In one embodiment, the entry and exit of the heat transfer label (3) to and from the first vacuum box (19) is adjusted (e.g., by the placement of a first idler (15) and a first nip (27)) as to have the heat transfer label (3) minimize contact with the first and second side walls (23, 25) of the first vacuum box (19). In such an embodiment, the friction against the heat transfer label (3) in the first vacuum box (19) is ideally minimized.

First Nip

The apparatus (1) comprises a first nip (27), having a second roller (29) (preferably a low inertia roller) and a second servo motor driven roller (31) with the heat transfer label (3)

therebetween, that tensions the heat transfer label (3) downstream from itself. The two rollers (29, 31) "nip" the label (3)/web therebetween.

The second roller (29) is analogous to the previously described first roller (17).

The servo motor (not shown) of the second servo motor driven roller (31) is analogous to the motor previously described first servo motor driven spindle (13) in that the second servo is also similarly linked to the PLC (not shown). The PLC may be used to adjust the speed and/or torque of the second servo motor.

However, the second servo motor driven roller (31) comprises a polyurethane outer coated hub. The polyurethane may comprises a 40 Shore A white urethane that is ⅛ inch thick.

The heat transfer label (3) (or web) is thread between the second roller (29) and the roller of the second servo motor driver roller (31) of the first nip (27). The second roller (29) and the roller of the first servo motor driven roller (31) "nip" the heat transfer label (3) therebetween. An air cylinder (not shown) pushes the second roller (29) against the first servo motor driven roller (31) providing the nip pressure. The second servo driven roller (31) is in a fixed position. A non-limiting example of such an air cylinder comprises NC(D)Q2, Compact Cylinder, Double Acting, Single Rod, from SMC Pneumatics, Indianapolis, Ind. This air cylinder may provide nip pressure in the order of about 20 PSI to about 35 PSI (pounds per square inch), alternatively from a bout 100 kPa to about 275 kPa, alternatively from about 125 kPa to about 250 kPa. In one embodiment, the pressure per length of the nip is from about 35 g/mm to about 75 g/mm, alternatively from about 40 g/mm to about 70 g/mm, alternatively from about 45 g/mm to about 65 g/mm, alternatively from about 50 g/mm to about 60 g/mm, alternatively combinations thereof.

The second servo motor (unlike the first servo motor) of the first nip (27) is operated "forwards," i.e., compelling the heat transfer label (3) to move forward or upstream in the labeling process, as well as backwards, by the PLC. Without wishing to be bound by theory, having the second servo motor operating backwards (i.e., upstream) provides tension to the heat transfer label (3) downstream from the first nip (27).

There are three electronic cam profiles determined in the apparatus (1) for the heat transfer label process. Of course the invention need not be limited to these three. The PLC coordinates these cam profiles. The first, of the three, cam profiles is determined at the first nip (27). A cam profile is typically determined by taking into account parameters such as radius of the container to be labeled, container pitch, speed of the manufacturing lines carrying containers into and out of the labeling process, container curvature, label attachment angle, label dimensions, label pitch, and the like, and combinations thereof. Any one of the three electronic cam profiles also takes into consideration the other two electronic cam profiles. Electronic cams control the motion of the servo motors. Besides the first nip (27), electronic cams control the servo motor at the second nip (51) (i.e., the third servo motor driven roller (55)), and the second servo linear motor (not shown) operably connected to the heat label applicator (39).

Dynamically Adjustable Heat Idler or Second Idler

The apparatus (1) comprises a dynamically adjustable heater idler (33) or second idler (33) as a component. The terms "dynamically adjustable heat idler" (33) and "second idler" (33) generally refer to the same component. The term "dynamically adjustable heat idler" refers to the component when the apparatus (1) is heat labeling containers. The term "second idler" refers to generally the same component when the apparatus (1) is pressure labeling containers. The second idler (33) is typically in a fixed position (relative to the heater plate (35)) when the apparatus (1) is pressure labeling containers.

During the heat labeling process, the dynamically adjustable heat idler (33), or simply "heat idler" (33), adjusts a contact length of the heat transfer label (3) relative to a heating surface (37) of a heater plate (35). The dynamically adjustable heat idler (33) comprises a third roller (32) (preferably a low inertia roller) and a first linear servo linear motor (not shown).

The term "contact length" means the linear distance, i.e., length, the heat transfer label (3) makes contact with the heating surface (37) of the heater plate (35) as the heat transfer label (3) winds through the apparatus (1). Non-limiting examples of the contact length includes from about 0 cm to about 35 cm.

One skilled in the art will readily appreciate that a contact length of about 0 cm has less heat transferred to the heat transfer label (3) than a contact distance greater than about 0 cm. In one embodiment, when an assembly line of containers to be labeled stops, the contact length is adjusted to about 0 cm by the heat idler (33) (and thus the heat label web (7)) moving away relative to the heating surface (37) (of the heater plate (35)). Without wishing to be bound by theory, having a contact length about 0 cm prevents undesired heat from being transferred to the heat transfer label (3) and thus preventing (or mitigating) the negative consequences associated with too much heat being applied to the heat transfer label (3). Accordingly, the apparatus (1) provides flexibility in the manufacturing process to stop the heat label labeling process that may not be available for some previously described apparatuses. This flexibility may provide financial and time savings otherwise spent on scrap heat transfer label; scrap in containers that are not label properly (e.g., while the apparatus gets up to speed), start up time, and/or the like.

Furthermore, the ability to adjust the contact length (and thereby the amount of heat that is transferred to the heat transfer label (3)) may allow the operator to adjust speeds of the apparatus (1) and thus the labeling process (and perhaps the overall assembly line process). Moreover, adjusting the contact length is faster and more reliable than, for example, modifying the heat of the heater plate (35) or cooling the heater plate (35) (as a means of controlling the heat that is transferred to the heat transfer label (3)).

In one aspect of the invention, the heat idler (33) adjusts the contact length of the heat transfer label (3) from the third roller (32) of the heat idler (33) by the servo linear motor by changing the linear distance (in one embodiment the perpendicular distance) of the roller (32) relative to the heating surface (37). The servo motor, preferably linear servo motor, moves the heat idler (33) via a path (34), preferably a linear path (34). In FIG. 1, the path (34) is perpendicular relative to the heating surface (37) of the heater plate (35). Although a linear path (34) is exemplified in FIG. 1, the path may be non-linear (e.g., arced or curved, etc.), or linear but non-perpendicular relative to the heating surface (37) of the heating plate (35)).

Figure 2:
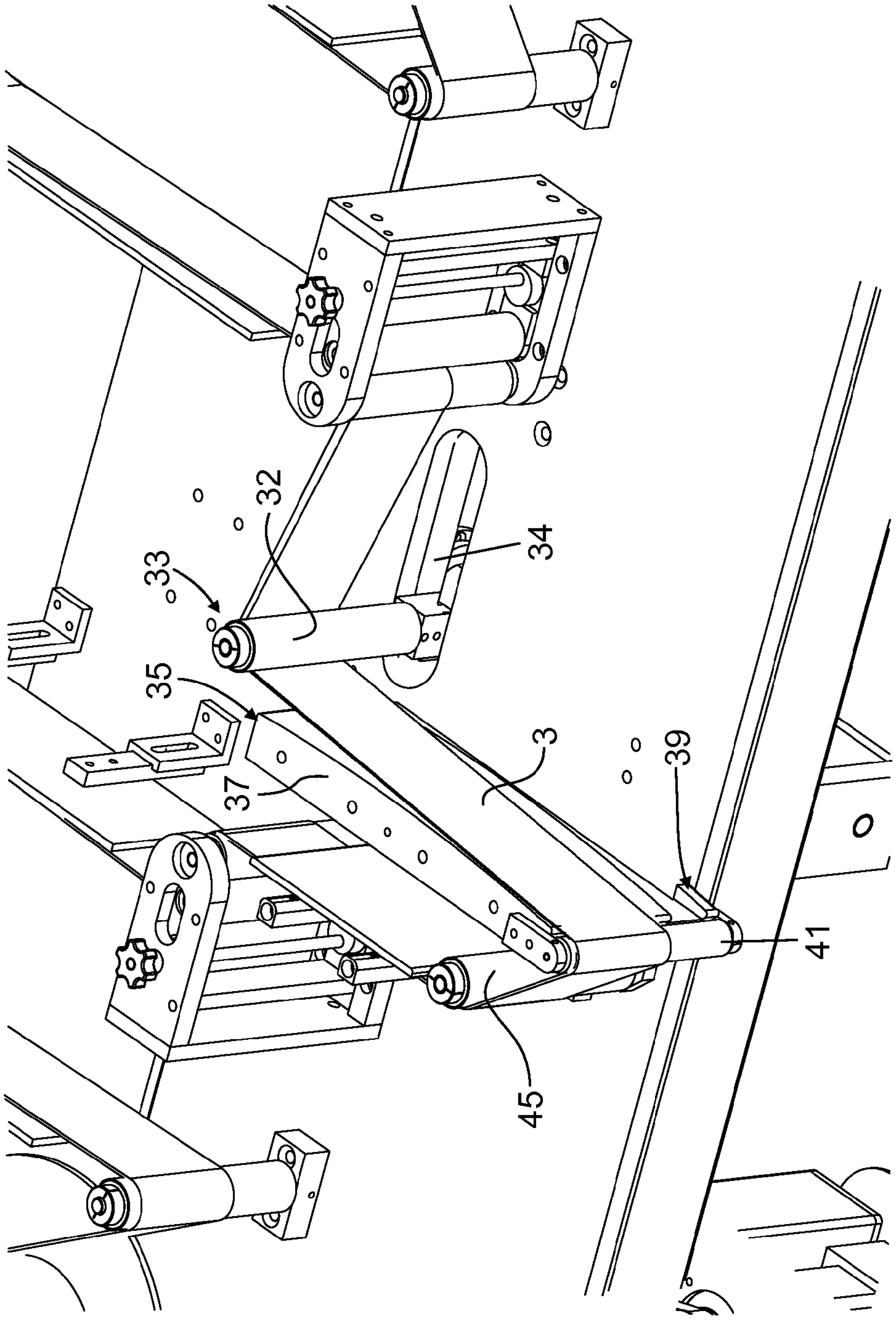
FIG. 2 is a perspective view of the heat idler of the apparatus of FIG. 1 in a position to maximize heat transfer from the heating surface of the heater plate to the heat transfer label.
Figure 3:
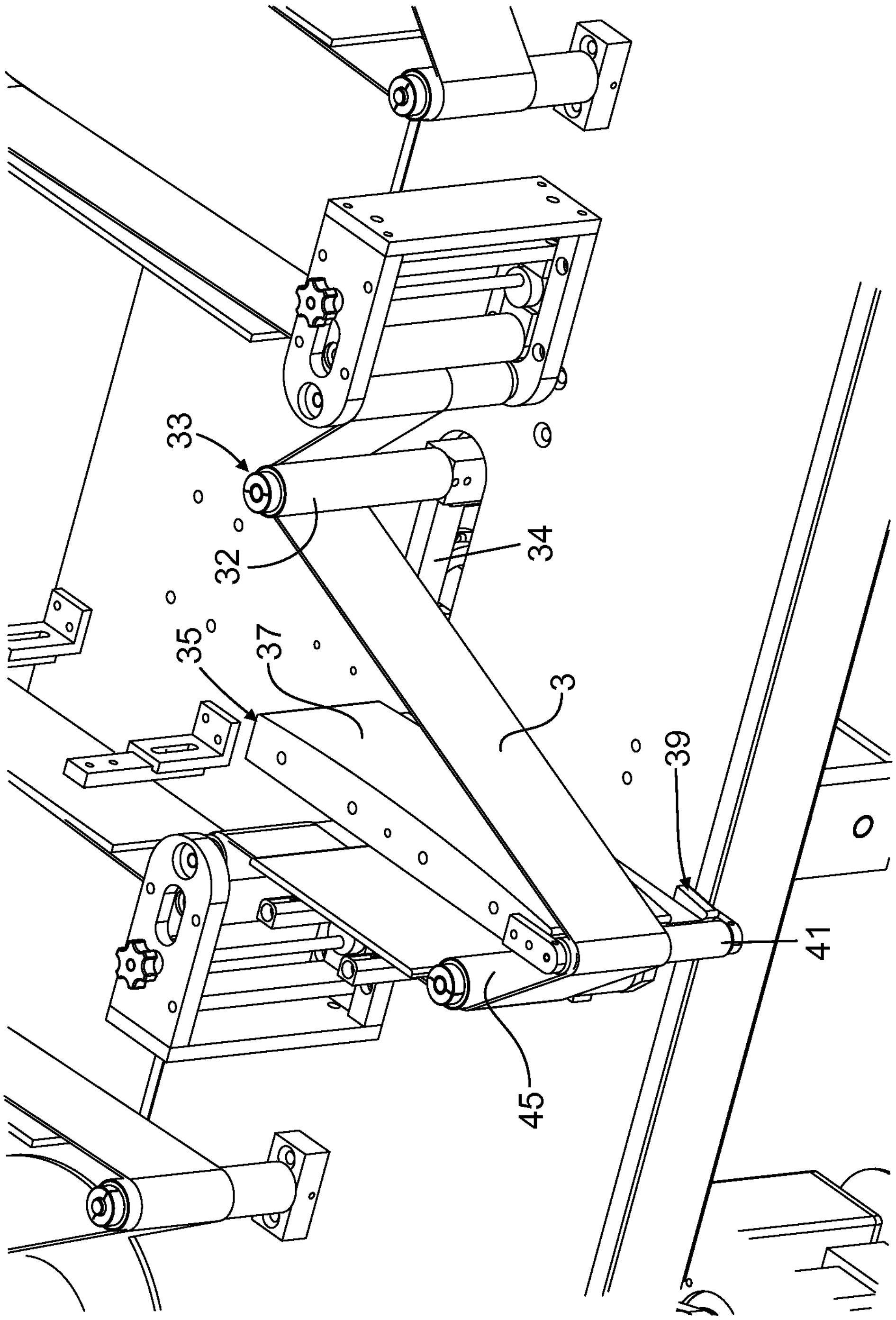
FIG. 3 is a perspective view of the heat idler of the apparatus of FIG. 1 in a position to minimize heat transfer from the heating surface of the heater plate to the heat transfer label.

In one embodiment, the perpendicular linear distance (irrespective of the path (34)) measured from the surface of the third roller (32) to the heating surface (37) of the heating plate (35) along a path (34) is about 200 cm (thereby minimizing heat transfer to the heat transfer label (3)). In FIG. 2, the heat idler (33) is positioned on the path (34) such that the perpendicular linear distant from the heat surface (37) is minimized, i.e., providing maximum heated/heat contact length to the heat transfer label (3). In FIG. 2, the heat idler (2) is about 0 cm along the path (34) providing about 368 mm of heat contact length, i.e., the maximum linear distance the heat transfer label (3) is making contact with the heating surface (37). Although not shown, if the heat idler (2) is moved about 1.3 cm along the path (34), the heat contact length is decreased to about 183 mm. If moved a total of about 2.5 cm (i.e., from the starting position of 0 cm), the heat contact length is decreased to about 91 mm And if moved a total of about 5 cm, the heat contact length is about 0 mm, i.e., zero, heat contact length. The heat idler (2) may be moved a maximum of about 15 cm to minimize heat being transmitted to the heat transfer label (3). FIG. 3 is illustrative of the heat idler (2) in this position (i.e., of minimizing heat to the label (3)).

In one embodiment, the distance of the path (34) is from about 0.1 cm to about 100 cm, alternatively from about 1 cm to about 75 cm, alternatively from about 2 cm to about 50 cm, alternatively from about 3 cm to about 25 cm, alternatively from about 4 cm to about 15 cm, alternatively from about 5 cm to about 10 cm, alternatively from about 1 cm to about 10 cm, alternatively combinations thereof.

In another embodiment, the heat contact length is from about 0 mm to about 3,000 mm, alternatively from about 0 mm to about 3,000 mm, alternatively from about 0 mm to about 1,000 mm, alternatively from about 0 mm to about 500 mm, alternatively combinations thereof.

As previously described, a servo motor, preferably servo linear motor, moves the heat idler (33) via the oath (34), preferably a linear oath (34). The heat idler (33) may be positioned along the path (34) by the servo motor very quickly i.e., within one second or less. In one embodiment, the heat idler is re-positioned on the track from about 0.1 second to about 1 second.

In yet another embodiment, wherein the moving the roller (32) of the heat idler (33) along the path (34) to change the heating contact length is completed from about 0.001 seconds to about 1 minute, alternatively from about 0.01 seconds to about 5 seconds, alternatively from about 0.1 seconds to about 3 seconds, alternatively from about 0.5 seconds to about 2 seconds, alternatively combinations thereof.

Without wishing to be bond by theory, the amount of heat that is transferred from the heater plate (35) to the heat transfer label (3) generally has a direct relationship to the heat contact length that heat transfer label (3) makes with the heating surface (37). In other words, the greater the heat contact length, the greater the heat that is transferred to the heat transfer label (3).

The entire heating surface (37) of the heater plate (35) need not be perfectly flat along its length (i.e., longest dimension). Rather, the heating surface (37) may be arced, curved, bowed, etc., such that when the distance of the path (34) is adjusted (and thus the heat idler (33)) adjusted, the contact length is adjusted in a more linear, gradual manner rather than if the heating surface was perfectly flat. In one embodiment, the radius of the heat surface (37) is arced at radius of about 206 cm, alternatively from about 150 cm to about 250 cm, alternatively from about 100 cm to about 300 cm.

Referring back to FIG. 1, the third roller (32) of the heat idler (33) is like the previously described first and second rollers (17, 29 respectively).

The first linear servo motor of the heat idler (33) is connected and operated by the PLC. A non-limiting example of such a motor includes LC-030 linear servo motor from Allen Bradley.

Heater Plate

The apparatus (1) comprises a heater plate (35). The heater plate has an overall length of about 35 cm (longest dimension and parallel to the top surface (2) of the apparatus (1)) and height (perpendicular to the top surface (2)) of about 17 cm. The heater plate (35) preferably comprises a constant temperature (thereby making the heat emitted from the heater plate essentially a "single variable"). Although the temperature setting of the heater plate (35) will depend upon the overall operating conditions of the labeling process, ranges includes from about 20° C. to about 260° C.

In one embodiment, a single heater plate is used verses two or more heater plates and/or two more heating surfaces and/or heating zones (as in some previously described processes/apparatuses). Having a single heater plate (35) and single heating surface (37) (and single heating zone), according to the present invention, reduces complexity of the system, enables temperature to be more constant/consistent than a two component system, which therefore provides more predictable labeling operating conditions. For purposes of clarification, the heating surface (37) of the heating plate (35) is the surface that heats the label transfer label (3) during heat labeling operation.

One skilled in the art will appreciate that a heating plate takes time to cool down and time to heat up. The present invention saves time in the labeling process by mitigating costly delays in heating and cooling the heater plate (necessitated, e.g., by unplanned manufacturing stoppages) by simply adjusting the proximity of the heat transfer label (3) to the heat source (rather than modifying the temperature of the heating plate (35)).

In another embodiment, the heating surface (37), i.e., the surface of the heater plate (35), which the heat transfer label (3) makes periodic contact during the labeling process, comprises a Surface Finish Index. Such an Index can be measured by those means well known in the industry. In another embodiment, the heating surface (37) of the heater plate (35) comprises a Surface Finish Index from about 0.4 Micrometer (um) to about 1.2 um, alternatively from about 0.6 to about 1 um. In one embodiment, the Surface Index is about 0.8 um, Without wishing to be bound by theory, a smooth surface reduces potential friction to the heat transfer label. A surface coating may also be used to reduce friction.

Applicator

The apparatus (1) comprises a heat label applicator (39), which in turn comprises an applicator roller (41) that applies the label (not shown) of the heat transfer label (3) to a container to be labeled (not shown) during the labeling processes. In one embodiment, as in FIG. 1, the heat label applicator (39) and the heater plate (35) are integral. An example of an applicator roller (41) is one having a diameter of 2.8 cm, 20 shore hardness on the "A" scale, purchased from Graphic Packaging International, Inc., Cincinnati, Ohio.

A second linear servo motor (not shown) moves the heat label applicator (39) (and thus the applicator roller (41) and heating plate (35)), in a perpendicularly linear motion relative to the container surface to be labeled, to apply the label of the heat transfer label (3) to the container. The linear distance traveled by the heat label applicator (39) depends on the container geometry and cycle time. In another embodiment, the heating plate and applicator are not integral, i.e., the heating plate is stationary whereas the applicator roller (31) moves back and forth (e.g., reciprocating) motion to apply the label of the heat transfer label (3) to the container. In yet another embodiment, the heat label applicator (39) moves in non-perpendicular linear motion relative the container surface to be labeled, such an arced or curved, etc. path.

A second, of three, electronic cam profiles is generated for the heat label applicator (39). Previously described variables are taken into account in generating this second electronic cam profile. The PLC coordinates the electronic cam profile of the heat label applicator (39) and in turn controls the applicator (39) or the integrated heat label applicator (39)/heater plate (35).

Containers may be brought to and from the applicator through those means known in the art, including but not limited to by conveyor.

In another embodiment, the apparatus may comprise pressure label applicator (not shown). A non-limiting example includes those described in U.S. Pat. No. 4,585,505; and U.S. Pat. No. 5,306,375.

Third Idler

The apparatus (1) may comprise a third idler (43) preferably comprising a fourth roller (45) (preferably a low inertia roller). The third idler (43) guides heat label web (7) (i.e., heat transfer label (3) with the heat label (not shown) removed) into a web chiller (47). As the heat label applicator (39) moves in a linear motion in applying the label to a container, the third idler (43) ensures a constant feed angle of the heat label web (7) into the web chiller (47).

The fourth roller (45) is like the previously described third, second, and first low inertia rollers (32, 29, and 17 respectively).

Web Chiller

The apparatus (1) may comprise a web chiller (47). The web chiller (47) serves to cool the heat label web (7) as guided from the third idler (43). By chilling the heat label web (7), wax and other ingredients that may be found on the heat label web (7), will not come-off on equipment or components of the apparatus (1) (or at least mitigating what may come off). A goal is to have the heat label web (7) cooled to a temperature below about 95° C., preferably below about 85° C.

In one embodiment, the web chiller (47) comprises a cold air blower (not shown) blowing air, at a temperature from about −10° C. at a rate of about 1.13 $m^3$/min, at the side of the heat label web that had the heat label attached.

In another embodiment, the web chiller (47) comprises a chilling plate (49) (comprising of e.g., aluminum, making contact with the other side of the heat label web (7) that did not comprise the heat label. A web chiller (47) is commercially available from McMaster Can, Atlanta, Ga., Part #31035k18. The web chiller (47) is attached by quick release clamps or similar device to minimize change over time (i.e., changing from a heat labeling process to a pressure labeling process). Of course the web chiller (47) may be simplified turned off during the pressure labeling process.

Second Nip

The apparatus (1) comprises a second nip (51) (much like the first nip (27)), having a fifth roller (53) (preferably low inertia roller) and a third servo motor driven roller (55) with the heat label web (7) or pressure transfer label therebetween.

The fifth roller (53) is like the previously described first, second, third, and fourth rollers (17, 29, 32, 45, 53 respectively).

The servo motor (not shown) of the third servo motor driven roller (55) is analogous to the motor previously described first and second servo motor drive rollers (17, 29 respectively) in that the third servo motor is similarly linked to the PLC (not shown). The PLC may be used to adjust the speed and/or torque of the servo motor of the third servo motor driven roller (55).

The third servo motor driven roller (55) comprises a polyurethane outer coated hub like hub of the second servo motor driven spindle (33) as previously described.

The heat label web (7) is thread between the fifth roller (33) and the roller of the third servo motor driven roller (55). Analogous to the first nip (27), the fifth low inertia roller (33) and the spindle of the third servo motor driven roller (55) "nip" the heat label web (7) (or pressure transfer label) therebetween. An air cylinder (not shown) pushes the fifth roller (53) against the third servo motor driven roller (55) providing nip pressure. The third servo motor driven roller (55) is in a fixed position. Examples of the air cylinder and nip pressures are as previously described in the first nip (27).

The third servo motor (like the second servo motor but unlike the first servo motor) of the second nip (51) is operated "forwards," i.e., compelling the heat label web (7) to move forward or upstream in the labeling process, as well as backwards by the PLC. Without wishing to be bound by theory, having the third servo motor operating backwards provides tension to the heat transfer label (3) and heat label web (7) upstream from the second nip (51).

The second nip is the third and final of the electronic cam profiles in the apparatus (1). As previously discussed, the PLC coordinates this cam and the other two cams (and the variables previously described).

Second Vacuum Box

The apparatus (1) comprises a second vacuum box (57) vacuuming the heat label web (7) received from the second nip (51) (or other such upstream component), alternatively the second vacuum box (57) vacuums the pressure transfer label received from the second winder (75).

During the heat labeling processes, the heat label web (7) upstream to the second vacuum box (57) is subject to dynamic movement. The second vacuum box (57) disengages this motion of the upstream components/processes from the downstream heat label web (7) rewinding step (discussed infra). In other words, the second vacuum box (57) allows the rewinding process to be constant verses an indexed process.

A typical vacuum range would be those previously described for the first vacuum box (19). Similarly the second vacuum box (57) may also comprises a second back wall (59), a third side wall (61), and a fourth side wall (63); wherein the third and fourth side walls (61, 63 respectively) are about parallel to each other; and wherein the third and fourth side walls (61, 63) are about perpendicular to the second back wall (59). The second back wall (59) of the second vacuum box (57) may also comprise a second vacuum opening (69) where a vacuum hose is attached (not shown) to suction the heat label web (7) toward the second back wall (59) (by a vacuum motor). The second top wall (22) and second bottom wall (24) encase the heat label web (7) within the second vacuum box (57).

The dimensions/specifications of the vacuum motor, and walls (59, 61, 63, 65, 67) of the second vacuum box (57) are those as previously described for the first vacuum box (19). Ways of controlling the tension of the heat label web (7) of the second vacuum box (57) are essentially the same as described for the heat transfer label in the first vacuum box (19). Ways of measuring and reporting the distance of the heat label web (7) of the second vacuum box (57) are essentially the same as described for the heat transfer label in the first vacuum box (19). Ways of minimizing friction against the heat label web (7) in the second vacuum box (57) is ideally reduced essentially the same as described for the heat transfer label (3) in the first vacuum box (19).

Fourth Idler

The apparatus (1) may comprise a fourth idler (71) preferably comprising a sixth roller (73) (preferably a low inertia roller). The fourth idler (71) guides heat label web (7) exiting from the second vacuum box (57) to a second winder (75) (discussed infra). Alternatively, the further idler (71) guides the pressure transfer label that is unwound from the second winder (75).

The sixth 1 roller (73) is like the previously described first, second, third, fourth, and fifth rollers (17, 29, 32, 45, 53 respectively).

Second Winder

The apparatus (1) may comprise a second winder (75). The second winder (75) winds the heat label web (7) into a heat label web roll (77). Alternatively, the second winder (75) unwinds the pressure transfer label from a pressure transfer label roll (10). The second winder (75) comprises a fourth servo motor driven spindle (79) that the heat label web roll (77) is functionally attached onto. The second winder (75) may also comprise a fourth servo motor (not shown) that is connected to a second spindle of the fourth servo motor driven spindle (79). The fourth servo motor applies tension to the winding of the heat label web (7) as to control the speed at which the heat label web (7) is wound into a heat label roll (77) thereby controlling the speed of heat label web (7) update in the heat labeling process.

The fourth servo motor (of the second winder (75)) may also be linked to the PLC that coordinates data from various points along the components of the apparatus (#1 to control inter alia the speed of the labeling process. The increasing diameter of the heat label web roll (77) may need to be accounted for in the labeling process by adjusting the speed and/or torque of the fourth servo motor. The PLC may be used to adjust this speed and/or torque.

Labeling Speed

In one embodiment, the apparatus labels about 1 to about 350 containers per minute, alternatively from about 50 to about 150 containers per minute, alternatively from about 150 to about 350 container per minute, alternatively from about 250 to about 300 container per minute; alternatively the apparatus labels containers faster than 100 container per minute, alternatively faster than 150 containers per minutes, alternatively faster than 200 containers per minute, alternatively faster than 250 containers per minute, alternatively faster than 300 containers per minute. In yet another embodiment, the apparatus labels containers at a constant speed and/or slows down the container labeling speed without stopping, or even substantially stopping, the labeling process.

The dimensions and values disclosed herein are not to be understood as being strictly limited to the exact numerical values recited. Instead, unless otherwise specified, each such dimension is intended to mean both the recited value and a functionally equivalent range surrounding that value. For example, a dimension disclosed as "40 mm" is intended to mean "about 40 mm"

Every document cited herein, including any cross referenced or related patent or application, is hereby incorporated herein by reference in its entirety unless expressly excluded or otherwise limited. The citation of any document is not an admission that it is prior art with respect to any invention disclosed or claimed herein or that it alone, or in any combination with any other reference or references, teaches, suggests or discloses any such invention. Further, to the extent that any meaning or definition of a term in this document conflicts with any meaning or definition of the same term in a document incorporated by reference, the meaning or definition assigned to that term in this document shall govern.

While particular embodiments of the present invention have been illustrated and described, it would be obvious to those skilled in the art that various other changes and modifications can be made without departing from the spirit and scope of the invention. It is therefore intended to cover in the appended claims all such changes and modifications that are within the scope of this invention.

What is claimed is:

1. An apparatus for labeling a container comprising:

(a) first winder capable of unwinding a heat transfer label from a heat transfer label roll,
  wherein the heat transfer label comprises a heat label releasably affixed to a heat label web;

(b) heat idler, comprising a roller, affixed along a path,
  wherein the roller is moveable along the path to adjust the distance relative to a heating surface,
  wherein the roller rolls unwound heat transfer label to define a heating contact length of the heat transfer label against the heating surface;
  wherein the heating contact length depends upon the position of the roller along the path;

(c) heat label applicator capable of applying the releasably affixed heat label to the container
  to provide a heat labeled container.

2. The apparatus of claim 1, wherein the path is substantially perpendicular to the heating surface.

3. The apparatus of claim 1, wherein the path comprises a distance from about 0.1 cm to about 100 cm relative to the heating surface.

4. The apparatus of claim 3, wherein the path comprises a distance from about 1 cm to about 10 cm relative to the heating surface.

5. The apparatus of claim 1, wherein the path is substantially perpendicular to the heating surface and the path comprises a distance of from about 1 cm to about 30 cm relative to the heating surface.

6. The apparatus of claim 5, wherein the heat idler further comprises a servo linear motor, wherein the servo linear motor is capable of moving the roller along the path.

7. The apparatus of claim 5, wherein the apparatus further comprises a first nip, wherein the first nip comprises a second roller and a second servo motor driver roller capable of nipping the heat transfer label between the second roller and the second servo motor driver roller, wherein the heat transfer label is received from the first winder.

8. The apparatus of claim 7, wherein the apparatus further comprises a second nip, wherein the second nip comprises a fifth roller and a third servo motor driven roller capable of nipping the heat label web received from the heat label applicator applying the heat label to container.

9. The apparatus of claim 7, wherein the apparatus further comprises a chiller capable of chilling the heat label from the heat label applicator applying the heat label to container.

* * * * *